(12) United States Patent
Chang

(10) Patent No.: US 6,906,356 B1
(45) Date of Patent: Jun. 14, 2005

(54) HIGH VOLTAGE SWITCH

(75) Inventor: Hsueh-Rong Chang, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 10/952,268

(22) Filed: Sep. 27, 2004

(51) Int. Cl.[7] ........................ H01L 29/74; H01L 31/111
(52) U.S. Cl. ........................ 257/130; 257/133; 257/135
(58) Field of Search ................................ 257/124, 121, 257/130, 133, 135, 273

(56) References Cited

U.S. PATENT DOCUMENTS

| | | | | |
|---|---|---|---|---|
| 5,304,821 A | * | 4/1994 | Hagino | ........................ 257/133 |
| 5,488,236 A | * | 1/1996 | Baliga et al. | ................ 257/132 |
| 5,554,862 A | * | 9/1996 | Omura et al. | ................ 257/137 |

OTHER PUBLICATIONS

*Power Semiconductor Devices, Insulated Gate Bipolar Transistor*, Chapter 8, p. 246, B. Jayant Baliga, North Carolina State University, PWS Publishing Company, copyright 1996.

*500–V n–Channel Insulated–Gate Biploar Transistor with a Trench Gate Structure*, H.–R. Chang, B.Jayant Baliga, *IEEE Transactions on Electron Devices*, vol. 36, No. 9, Sep. 1989.
*High–Voltage Accumulation–Layer UMOSFET's in 4H–SiC*, J. Tan, JaA. Cooper, Jr., M.R. Melloch, *IEEE Electron Device Letters*, vol. 19, No. 12, Dec. 1998.

* cited by examiner

*Primary Examiner*—Phat X. Cao
(74) *Attorney, Agent, or Firm*—Koppel, Jacobs, Patrick & Heybl

(57) ABSTRACT

A high power switch includes diode and BJT structures interdigitated in a drift layer and separated by insulated trench gates; electrodes contacting the diode and BJT structures provide anode and cathode connections. Shallow N+ regions extend below and around the corners of the oxide side-walls and bottoms of respective gates. A voltage applied across the anode and cathode sufficient to forward bias the diode's p-n junction causes electrons to be injected which provide a base drive current to the BJT sufficient to turn it on and enable current to flow from anode to cathode via the diode and BJT structures. A gate voltage sufficient to reverse bias the junction between the shallow N+ regions and the drift layer forms a potential barrier which blocks current flow through the diode and BJT structures and eliminates the base drive current such that the BJT and said switch are turned off.

23 Claims, 5 Drawing Sheets

HIGH VOLTAGE SWITCH

BACKGROUND OF THE INVENTION

1. Field of the Invention

This invention relates to the field of high power semiconductor switches.

2. Description of the Related Art

Semiconductor devices are increasingly required to accommodate high currents and/or high voltages without failing. Many high power applications call for the use of a semiconductor switch which is required to conduct a large current when turned on, and to block a high voltage when off.

One device used in such applications is the power metal-oxide-semiconductor field-effect transistor (MOSFET). As discussed in J. Baliga, *Power Semiconductor Devices*, PWS Publishing Co. (1996) at p. 426, a power MOSFET exhibits excellent fast switching capability and safe-operating-area. When designed to block relatively low voltages (less than 200 volts), the power MOSFET has a low on-resistance. However, on-resistance increases very rapidly when its breakdown voltage is increased. This makes the on-state power losses unacceptable where high DC supply voltages are used.

Another approach which has been explored to improve blocking voltage while maintaining low on-resistance has been the fabrication of FETs using silicon carbide (SiC). SiC has a wider bandgap than does silicon, giving it a "critical electric field"—i.e., the peak electric field that a material can withstand without breaking down—that is an order of magnitude higher than that of silicon (Si). This allows much higher doping and a much thinner drift layer for a given blocking voltage, resulting in a very low specific on-resistance in SiC-based devices.

Unfortunately, many SiC devices developed to date exhibit severe commercialization constraints. One such device is described in "High-Voltage Accumulation-Layer UMOSFET's in 4H-SiC", IEEE Electron Device Letters, Vol. 19, No. 12 (Dec. 1998), pp. 487–489. This SiC-based device employs a UMOS structure, with an accumulation channel formed on the sidewalls of the trench by epitaxial growth to attain enhancement mode operation. It requires an additional epitaxial layer under the p-base to promote current spreading and achieve low on-resistance. The doping levels and the thicknesses of the sidewall epilayer and the epilayer under the p-base must be tightly controlled to achieve an enhancement mode device with low on-resistance. These demands result in a complex fabrication process which is unsuitable for large-scale manufacturing.

Another high power device is the insulated-gate bipolar transistor (IGBT). An IGBT with a trench gate structure is described, for example, in H.-R. Chang and B. Baliga, "500-V n-Channel Insulated-Gate Bipolar Transistor with a Trench Gate Structure", IEEE Transactions on Electron Devices, Vol. 36, No. 9, September 1989, pp. 1824–1828. In operation, a positive gate voltage forms N-type inversion layers, through which electrons flow to provide the base drive needed to turn on the device's PNP transistor.

However, the IGBT has disadvantages which render it unsuitable for some applications. Because the structure is basically a transistor with gain, there will be some recombination in its N− drift region, causing the device to exhibit a high forward voltage drop ($V_{FD}$). Another drawback to IGBTs is that they can "latch-up", at which point they are no longer under the control of the gate voltage. When in this mode, conduction through the device can no longer be controlled by the gate voltage.

SUMMARY OF THE INVENTION

A high power switch is presented which overcomes the problems noted above. The switch is particularly well-suited to high power switching applications, providing a very low on-resistance and a high blocking voltage.

One embodiment of the present switch is built on a foundation comprising a first N+ substrate layer, which is contacted by a first electrode to provide a cathode connection for the device, and a P− drift layer on the first N+ substrate layer. A diode structure is formed which includes the foundation layers, along with a P+ layer on the P− drift layer and a second electrode which contacts the P+ layer. A bipolar transistor (BJT) structure is formed which includes the foundation layers, along with an N+ layer on the P− drift layer, and a third electrode which contacts the N+ layer. The second and third electrodes are connected together to provide an anode connection for the device.

The device includes an insulated gate, arranged in a trench configuration and recessed into the device foundation between the diode and BJT structures. The gate comprises a U-shaped layer of oxide which forms the side-walls and bottom of the trench. The trench is filled with a conductive material, which is in contact with a fourth electrode that provides a gate connection for the device; the conductive material conducts a voltage applied to the gate connection to the oxide layer. A shallow N+ region extends from the oxide bottom of the insulated gate into the P− drift layer and extends around the corners formed at the intersections of the gate's oxide side-walls and bottom.

The device is arranged such that a voltage applied across the anode and cathode connections sufficient to forward bias a first junction formed at the interface of the diode structure's P− drift and first N+ substrate layers causes electrons to be injected into the P− drift portion of the BJT structure, thereby providing a base drive current to the BJT sufficient to turn it on and enable current to flow from the anode to the cathode via the diode and BJT structures. To turn off the switch, a voltage is applied to the gate connection sufficient to reverse bias a second junction formed at the interface of the shallow N+ region and the P− drift layer, thereby forming depletion regions which, when the second junction is sufficiently reverse-biased, merge and form a potential barrier that blocks current flow through the diode and BJT structures and eliminates the base drive current such that the BJT is turned off.

A practical high power device is formed by interdigitating a plurality of BJT, diode and insulated gate structures in the device foundation, each gate positioned between a respective pair of diode structures, a respective pair of BJT structures, or a respective pair of diode and BJT structures. The ratio of diode to BJT structures is varied to obtain a desired combination of device characteristics.

Further features and advantages of the invention will be apparent to those skilled in the art from the following detailed description, taken together with the accompanying drawings.

BRIEF DESCRIPTION OF THE DRAWINGS

FIG. 2 is a sectional view of the switch of FIG. 1, illustrating its operation when on.

DETAILED DESCRIPTION OF THE INVENTION

Figure 1:
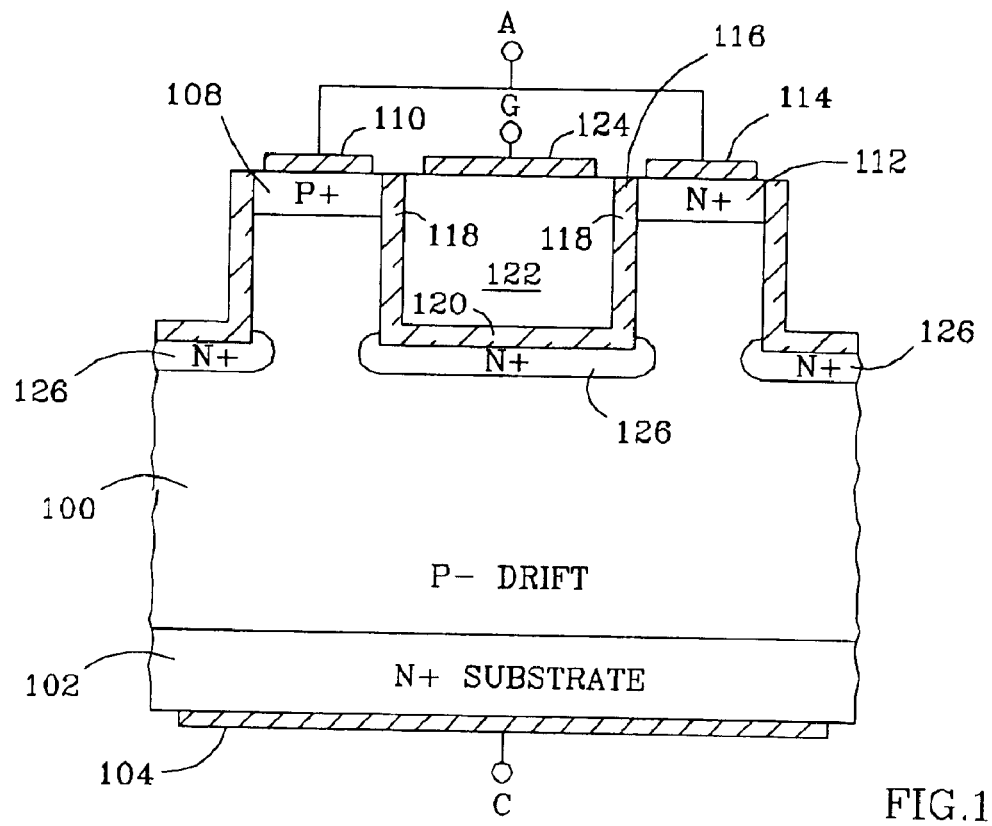
FIG. 1 is a sectional view of one embodiment of a high power switch per the present invention.

An exemplary embodiment of a switch in accordance with the present invention is shown in FIG. 1. A P– drift layer 100 of a desired thickness is on a first N+ substrate layer 102. A layer of metal 104 on N+ substrate layer 102 provides a cathode connection for the switch. Layers 100, 102 and 104 form a foundation for the switch.

A diode structure is formed which includes the foundations first N+ substrate and P– drift layers, along with a P+ layer 108 on the P– drift layer and a second electrode 110 which contacts the P+ layer. A bipolar transistor (BJT) structure is formed which includes the foundation's first N+ substrate and P– drift layers, along with a N+ layer 112 and a third electrode 114 which contacts the N+ layer. The second electrode 110 and the third electrode 114 are connected together to provide an anode connection for the device.

The device includes an insulated gate, arranged in a trench configuration and recessed into the device foundation, typically between the diode and BJT structures (as shown in FIG. 1). The gate comprises a layer of oxide 116 in contact with the diode's P+ layer 108, P– drift layer 100, and the BJT's N+ layer 112, which forms the walls 118 and bottom 120 of the trench. The trench is filled with a conductive material 122, which is contacted with a fourth electrode 124 that provides a gate connection for the device; the conductive material conducts voltage applied to the gate connection to the oxide layer. A shallow N+ region 126 extends from the oxide bottom of the insulated gate into P– drift layer 100 and extends around the corners formed at the intersections of the gate's oxide side-walls and. bottom.

Figure 2:
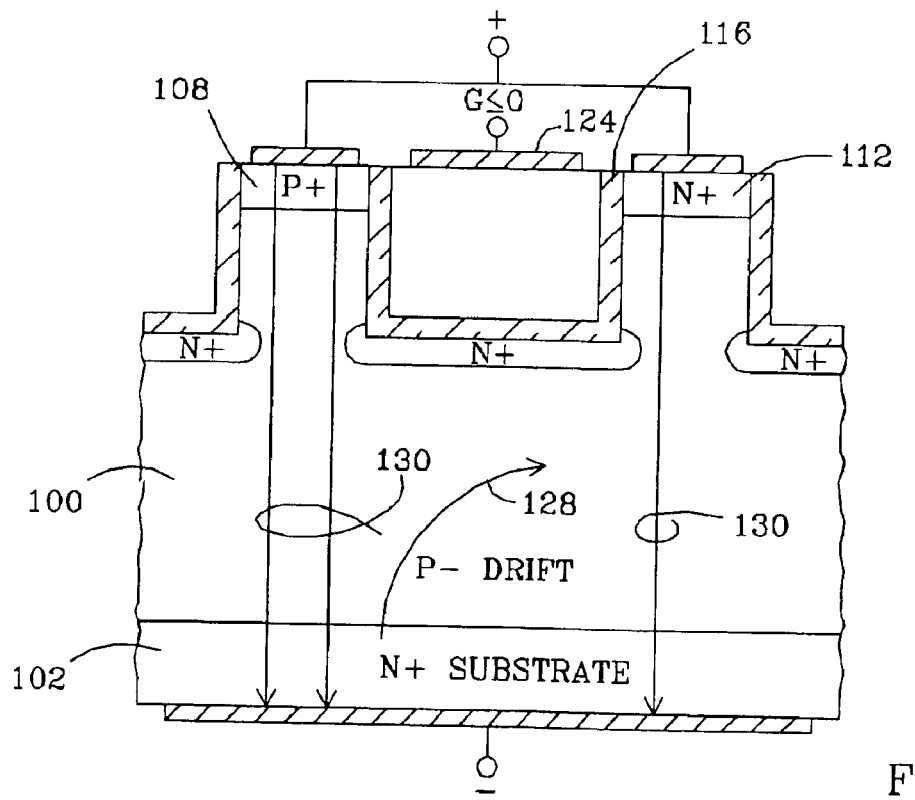

The novel switch's turn-on mechanism is illustrated in FIG. 2. A positive voltage is applied across the device's anode and cathode connections sufficient to forward bias a first p-n junction formed at the interface of P– drift layer 100 and N+ substrate layer 102; the voltage on gate terminal 124 would typically be less than or equal to zero during turn-on. Forward-biasing the diode causes electrons 128 to be injected into the P– drift layer 100, including the P– drift portion of the BJT structure, thereby providing a base drive current to the BJT sufficient to turn it on and enable current 130 to flow from the anode to the cathode via the diode and BJT structures.

The diode portion of the device has an inherently lower on-resistance than does the BJT portion. As such, most of current 130 flows through the diode and the overall device has a very low on-resistance.

Figure 3:
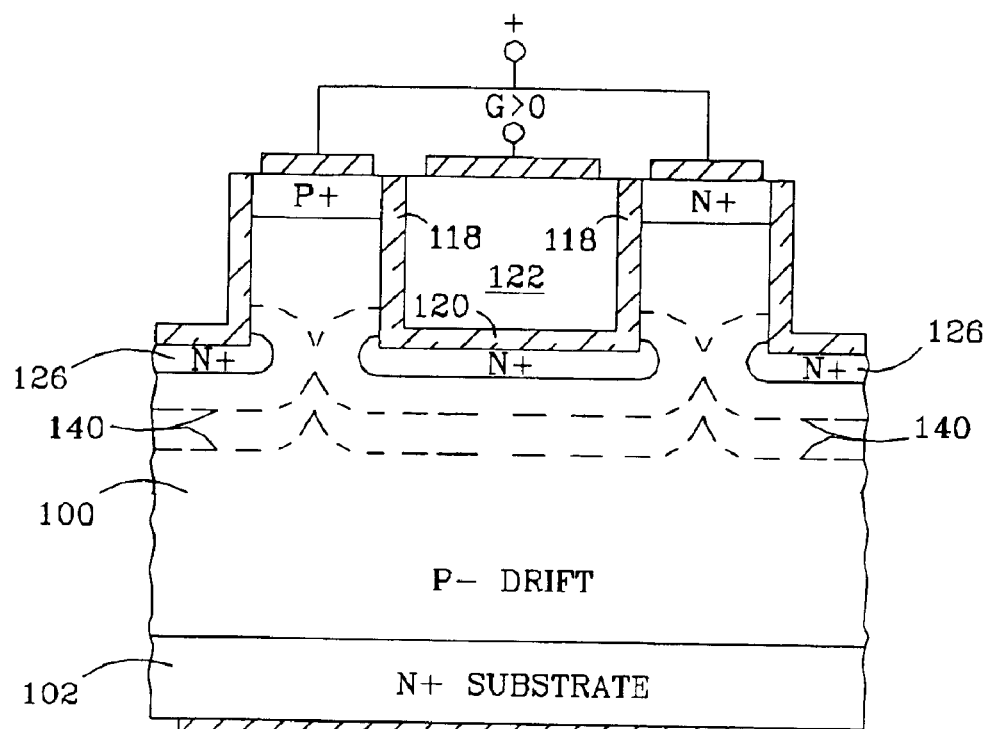
FIG. 3 is a sectional view of the switch of FIG. 1, illustrating its operation when off.

The present switch's turn-off mechanism is illustrated in FIG. 3. A voltage is applied to the gate connection sufficient to reverse bias a second p-n junction formed at the interface of shallow N+ regions 126 and P– drift layer 100. This causes depletion regions 140 to form around the shallow N+ regions and the insulated gate's oxide. When the second p-n junction is sufficiently reverse biased, the depletion regions merge and form a potential barrier that blocks current flow through the diode. As the barrier forms, the resistance on the BJT side will be less than it is on the diode side, and thus current through the device will be largely diverted through the BJT side of the device. However, with the barrier in place, the BJT's base drive is eliminated such that the BJT, and thus the entire switch, are turned off. The BJT is therefore essential to the switch's turn-off mechanism.

The trench gates are preferably recessed vertically into the device's foundation layers; i.e., with their side-walls approximately perpendicular to the top surface of drift layer 100. Referring back to FIG. 1, the conductive material 122 in the insulated gate's trench is preferably polysilicon which has been heavily-doped with acceptors. Polysilicon is preferred because it easily fills the trenches, but other materials that can fill the trenches and provide good conductivity could also be used.

When the switch is required to have a high blocking voltage (i.e., greater than about 300 volts), its N+ substrate and P– drift layers are preferably made from a semiconductor material having a bandgap voltage that is higher than that of silicon (Si), such as silicon carbide (SiC), gallium nitride (GaN), or diamond. The peak electric field that a material can withstand without breaking down, i.e., its "critical field", is proportional to its bandgap voltage. Thus, an SiC layer, for example, is able to sustain a peak field that is about 10 times greater than that supportable by an Si layer of comparable thickness.

Furthermore, the doping concentration a material is capable of attaining is proportional to its critical field. Thus, SiC's higher critical field enables the switch's material layers to have a doping concentration that is an order of magnitude higher than is possible with Si ($\sim 5 \times 10^{15}$ vs. $\sim 8 \times 10^{13}$ carrier/cm$^3$). For example, a switch with a 1200 volt blocking voltage could be provided with a drift layer made from Si having a doping density of about $8 \times 10^{13}$ carriers/cm$^3$ which is about 120 $\mu$m thick, or with an SiC drift layer having a doping density of about $5 \times 10^{15}$ carriers/cm$^3$ which is about 12 $\mu$m thick.

The higher doping concentration achievable with a wide-bandgap material also lowers the device's on-resistance when compared with an Si implementation. Use of a wide-bandgap material also reduces reverse leakage current. SiC's wide bandgap enables a device's reverse leakage current to be several orders of magnitude less than an Si-based device of comparable thickness. This factor also serves to increase the temperature at which the switch can be operated. Because reverse leakage current increases exponentially with temperature, conventional devices must be operated at lower temperatures to achieve leakage currents as low as that provided by an SiC implementation. Conversely, a switch fabricated from a wide-bandgap material such as SiC can be operated at higher temperatures while still meeting a given reverse leakage current specification.

The device's reverse blocking capability is determined by a number of factors, including the width of the diode and BJT structures, and the doping and thickness of P– drift layer 100. Wider structure widths tend to lower the device's on-resistance, but also lower its blocking voltage. Conversely, narrower structure widths improve the device's blocking capability, but also increase on-resistance.

The shallow N+ regions 126 protect the trench gate oxide from high electric fields. Thus, the doping of the shallow N+ regions should be sufficient to prevent them from becoming completely depleted when subjected to the switch's rated breakdown voltage. The shallow N+ regions 126 extend around the trench corners, to protect the corners from premature breakdown caused by high electric fields; this improves the reliability of the trench oxide and enhances the robustness of the switch's breakdown voltage characteristic.

The shallow N+ regions are preferably made shallow to limit lateral diffusion. To further limit lateral diffusion, it is preferred that shallow N+ regions 126 comprise a slow-diffusing material. For an SiC implementation of the switch, the preferred material for the shallow N+ regions is nitrogen.

Careful consideration must be given to the widths of the diode and BJT structures, and to the widths and depths of the trench gates. For example, if a diode or BJT structure is too narrow, lateral diffusion around shallow N+ regions 126 may act to pinch off the conductive path and block current flow. If too wide, the reverse blocking voltage may be adversely affected.

Figure 4:
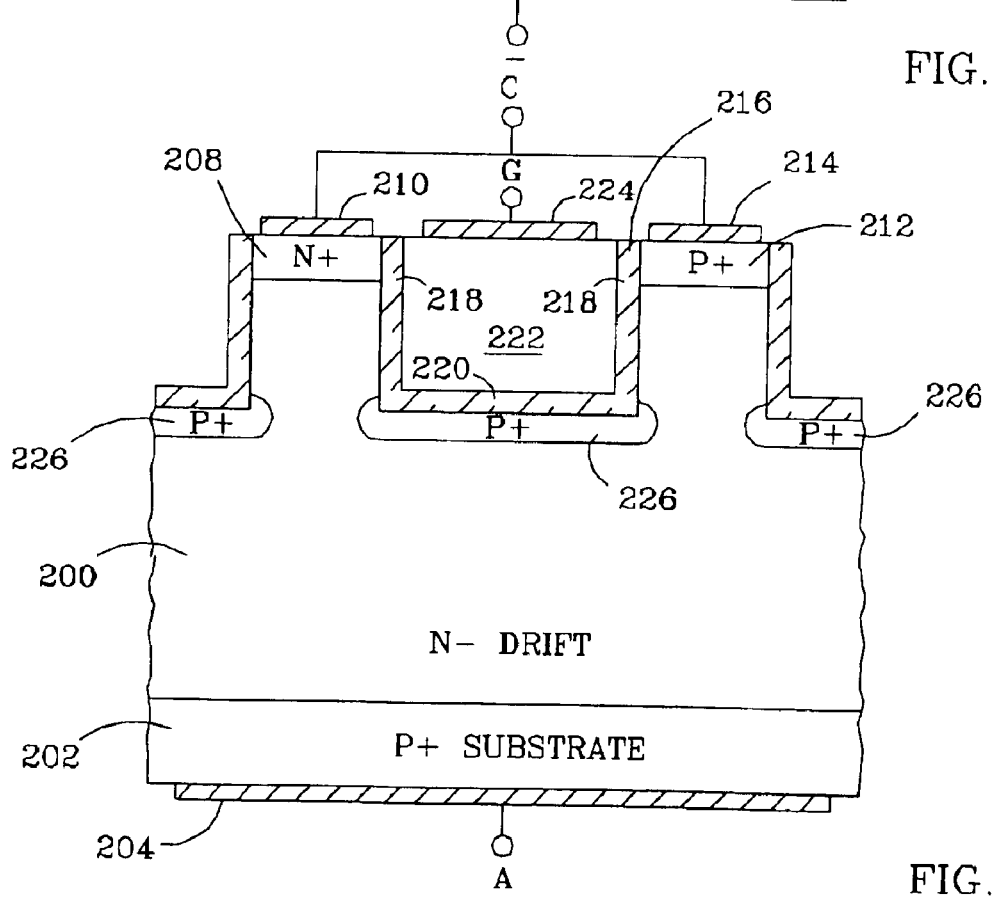
FIG. 4 is a sectional view of an opposite polarity version of the switch of FIG. 1.

The present switch is not limited to the structure shown in FIG. 1. An opposite polarity embodiment is shown in FIG. 4, in which each of the materials has been swapped with its opposite polarity counterpart. Here, a N– drift layer 200 is on a first P+ substrate layer 202, with a layer of metal 204 on layer 202 providing an anode connection for the switch. Layers 200, 202 and 204 form a foundation for the switch.

A diode structure is formed which includes the foundation's first P+ substrate and N– drift layers, along with a N+ layer 208 on the N– drift layer and a second electrode 210 which contacts the N+ layer. A BJT structure is formed on the foundation with the addition of a P+ layer 212, and a third electrode 214 which contacts the P+ layer. The second electrode 210 and the third electrode 214 are connected together to provide a cathode connection for the device.

The device's insulated gate comprises a layer of oxide 216 in contact with the diode's N+ layer 208, N– drift layer 200, and the BJT's P+ layer 212, which forms the walls 218 and bottom 220 of the trench gate. The trench is filled with a conductive material 222, which is contacted with a fourth electrode 224 that provides a gate connection for the device. A shallow P+ region 226 extends from the oxide bottoms of the insulated gate into drift layer 200 and extends around the corners formed at the intersections of the gate's oxide side-walls and bottom.

The switch functions as before, except that the switch is turned on by applying a positive voltage across the device's anode and cathode connections sufficient to forward bias a p-n junction formed at the interface of N– drift layer 200 and P+ substrate layer 202; the voltage on gate terminal 224 would typically be greater than or equal to zero during turn-on. Forward-biasing the diode causes holes to be injected into N– drift layer 200, including the N– drift portion of the BJT structure, thereby providing a base drive current to the BJT sufficient to turn it on and enable current to flow from the anode to the cathode via the diode and BJT structures. Turn-off is effected by applying a voltage to the gate connection sufficient to reverse bias a second p-n junction formed at the interface of shallow P+ regions 226 and N– drift layer 200.

Here, conductive material 222 is preferably polysilicon which has been heavily-doped with donors though other materials could also be used.

The switch can be fabricated on punch-through wafers (EPI), in which the drift layer is an epitaxial layer grown to a desired thickness on a bulk substrate material (as in FIG. 1, with epitaxial drift layer 100 on N+ bulk substrate 102), or on non-punch-through (NPT) wafers. Several factors should be considered when determining which wafer-type to use. EPI wafers are more expensive than NPT wafers, but because the P– epitaxial layer has a controlled thickness and doping concentration, they offer a lower on-resistance.

Figure 5:
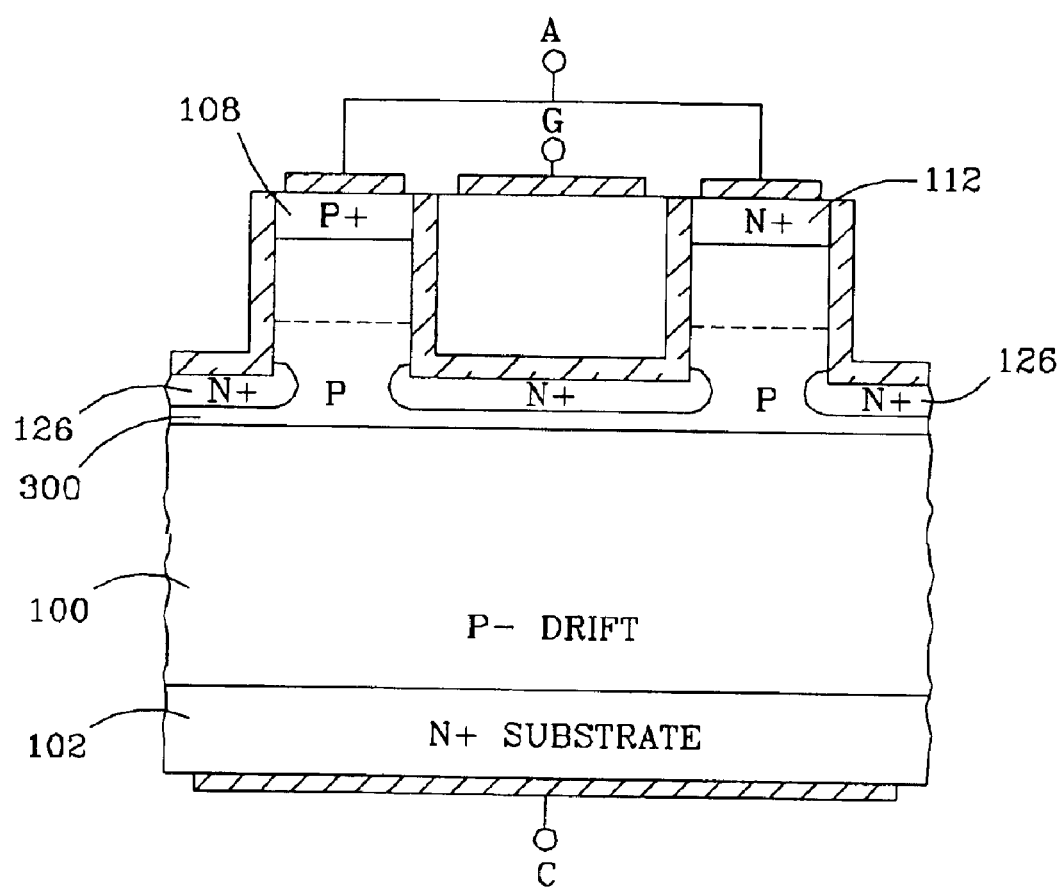
FIG. 5 is a sectional view of an alternative embodiment of a switch per the present invention.

Another possible embodiment of the switch is shown in FIG. 5. This structure is similar to that of the device in FIG. 1, except for the addition of a P-type layer 300 which completely envelops shallow N+ regions 126 and extends at least part of the way up to P+ layer 108 and N+ layer 112. As layer 300 is more heavily-doped than P– drift layer 100, the depletion regions that might otherwise be formed at zero gate bias and which can result in a "pinching effect" are reduced.

As described in more detail below, a practical high power switching device would typically include hundreds of diode, BJT and insulated gate structures interdigitated across a die. The ratio of diode structures to BJT structures is selected to obtain desired device characteristics. For example, increasing the number of diode structures with respect to the number of BJT structures tends to lower the device's on-resistance, but degrades its turn-off characteristics. Conversely, increasing the number of BJT structures with respect to the number of diode structures tends to improve the device's turn-off characteristics, but degrades its on-resistance.

It is not essential that each BJT structure be adjacent to a diode structure, and vice versa. A given insulated gate may be between two diode structures, between two BJT structures, or (as illustrated in FIGS. 1–5) between a diode structure and a BJT structure.

Figure 6:
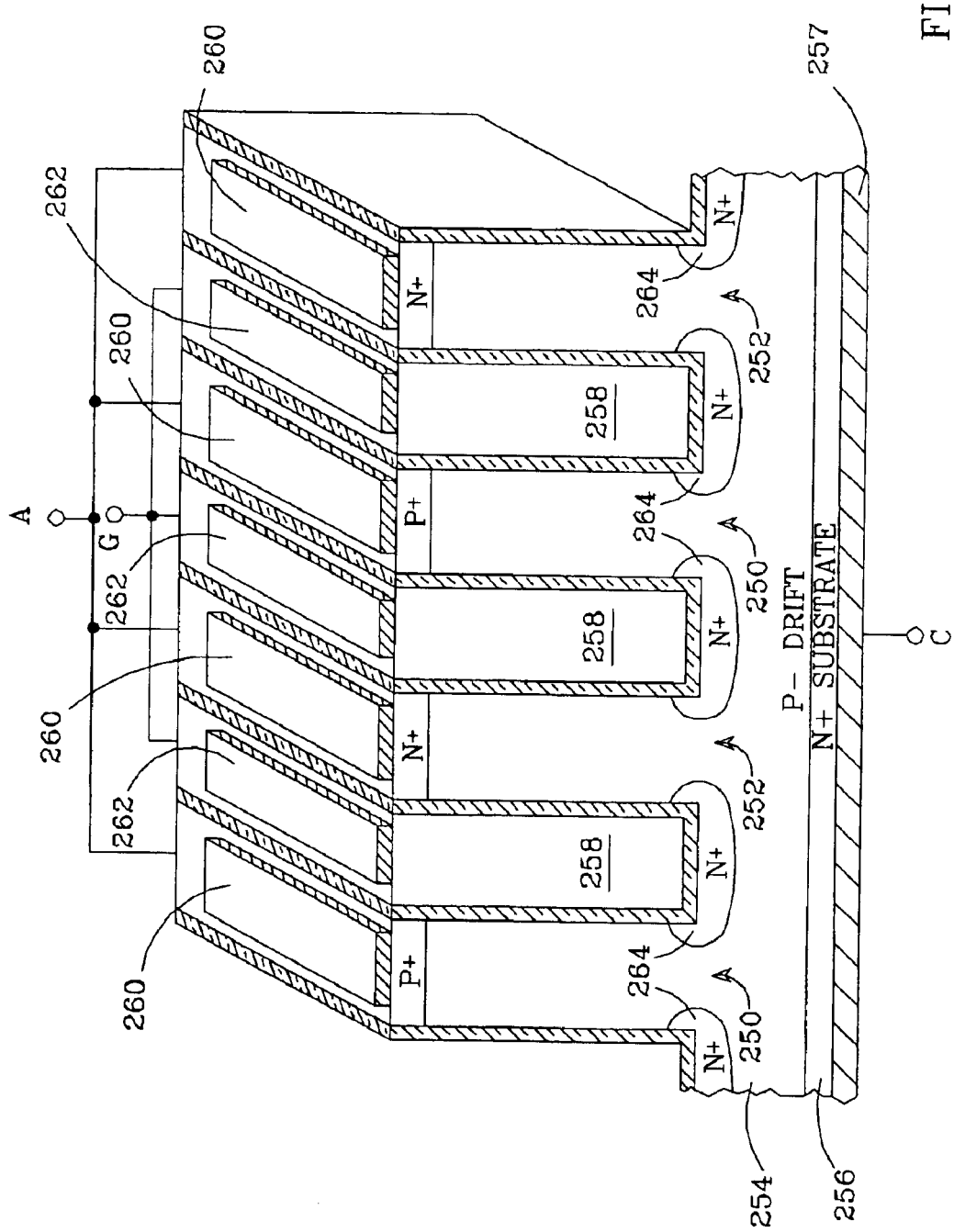
FIG. 6 is a perspective view of one possible implementation of a high power switch per the present invention.

As noted above, to create a practical device capable of carrying a high current, a number of diode, BJT, and insulated gate structures as described above are interdigitated across the device foundation; one embodiment of such a device is shown in FIG. 6. Here, diode (250) and BJT (252) structures as shown in FIG. 1 are spaced periodically within a foundation made from a P– drift layer 254 and a N+ substrate layer 256, with an electrode 257 on the N+ substrate layer serving as the device's cathode. Insulated trench gate structures 258 are located between every pair of adjacent diode and/or BJT structures. Electrodes 260 contact each of the diode and BJT structures and are connected together to form the device's anode, and electrodes 262 contact each of the gate structures and are connected together to form the device's gate connection. Shallow N+ regions 264 extend from around the corners of each trench gate into P– drift layer 254.

To provide a high power switch, the device's diode, BJT and insulated gate structures are repeated across a die having an area sufficient to provide the necessary current carrying capacity. The shape of the interdigitated structures is not limited to that of the trench-shaped stripes shown in FIG. 6. One possible alternative embodiment is shown in the plan view of FIG. 7 (electrodes not shown for clarity). Here, cylindrical diode structures 300 are interdigitated with cylindrical BJT structures 302. Each diode structure is as described above, with a P+ layer 304 on a P– drift/N+ substrate foundation 310, 312. Each BJT structure is also as described above, with an N+ layer 314 on the P– drift/N+ substrate foundation. Insulated trench gate structures are formed by surrounding each cylindrical diode and BJT structure with oxide walls 316, and horizontal oxide bottoms (not shown) traverse the areas between oxide walls. Shallow N+ regions (not shown) are employed to protect the oxide corners of the trench gates from peak fields as described above.

Figure 8:
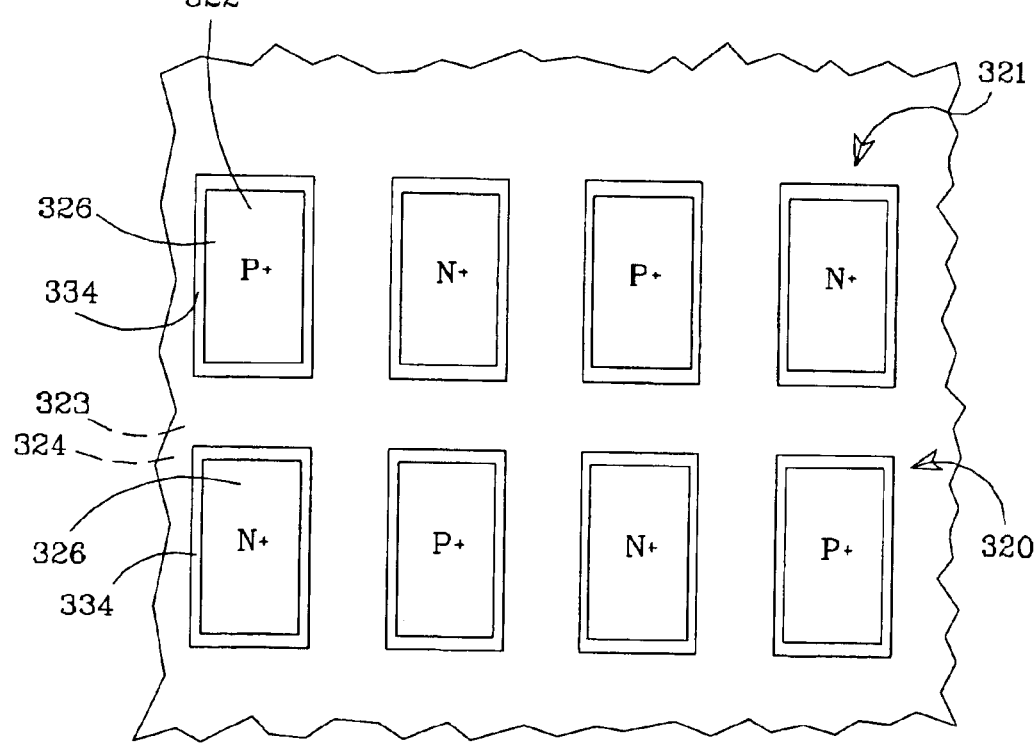
FIG. 8 is a plan view of another embodiment of a high power switch per the present invention.

Another possible multi-cell embodiment is shown in the plan view of FIG. 8 (electrodes not shown for clarity). Here, the continuous stripe trench structures shown in FIG. 6 are broken up into smaller diode structures 320 and BJT structures 321. Each diode structure has a P+ layer 322 on a P− drift/N+ substrate foundation 323, 324, and each BJT structure has a N+ layer 326 on the P− drift/N+ substrate foundation. Insulated trench gate structures are formed by surrounding each diode and BJT structure with oxide walls 334, and horizontal oxide bottoms (not shown) traverse the areas between oxide walls. Shallow N+ regions (not shown) are employed to protect the oxide corners of the trench gates from peak fields as described above. Breaking up the structures in this way may result in a more uniform turn-on characteristic for the device.

Figure 7:
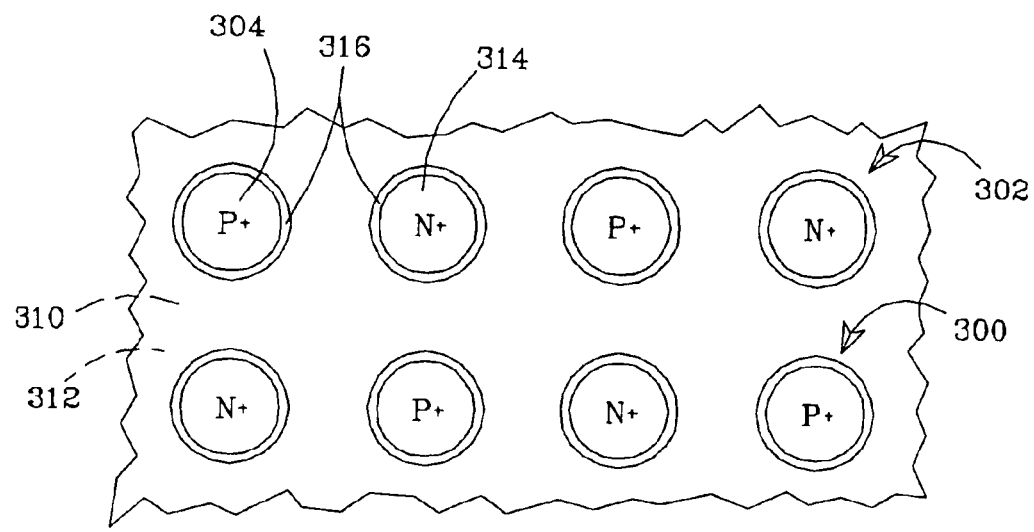
FIG. 7 is a plan view of one embodiment of a high power switch per the present invention.

The configurations shown in FIGS. 6, 7 and 8 are merely exemplary; many other structure shapes (including, for example, squares, squares with rounded corners, and hexagons), and structure ratios (number of diode structures/number of BJT structures) could be used to provide a functional device. The trench-shaped stripe structures of FIG. 6 are preferred, as they provide good performance while being easily fabricated.

As noted above, a high power switch is provided by employing an array of diode and BJT structures across a die. When so arranged, a switch as described herein can support a current density of at least 500 A/cm² with a forward voltage drop of 3.2 volts.

The high power switch is fabricated using conventional means well-known to those in the art of semiconductor fabrication. Though the device's trench structures require processing steps that are not necessary when fabricating other switch types, such as planar MOSFETs, the additional fabrication complexity is offset by the greatly improved performance of the device when used in high power applications.

While particular embodiments of the invention have been shown and described, numerous variations and alternate embodiments will occur to those skilled in the art accordingly, it is intended that the invention be limited only in terms of the appended claims.

I claim:

1. A switch, comprising:
    a device foundation, comprising:
        a first N+ substrate layer,
        a P− drift layer on said first N+ substrate layer, and
        a first electrode which contacts said first N+ substrate layer and provides a cathode connection for said device;
    a diode structure, comprising:
        said device foundation,
        a P+ layer on said P− drift layer, and
        a second electrode which contacts said P+ layer;
    a bipolar transistor (BJT) structure, comprising:
        said device foundation,
        a second N+ layer on said P− drift layer, and
        a third electrode which contacts said second N+ layer, said second and third electrodes connected together to provide an anode connection for said device;
    an insulated gate arranged in a trench configuration recessed into said device foundation between said diode and BJT structures, comprising:
        a layer of oxide in contact with said P+ layer, said P− drift layer, and said second N+ layer, said layer of oxide forming the walls and bottom of said trench,
        a conductive material within said trench which conducts a voltage applied to the top of said trench to said layer of oxide, and
        a fourth electrode which contacts said conductive material providing a gate connection for said device; and
    a shallow N+ region extending from the oxide bottom of said insulated gate into said P− drift layer and extending around the corners formed at the intersections of said gate's oxide side-walls and bottom;
    said device arranged such that a voltage applied across said anode and cathode connections sufficient to forward bias a first junction formed at the interface of said diode structure's P− drift and first N+ substrate layers causes electrons to be injected into the P− drift portion of said BJT, thereby providing a base drive current to said BJT sufficient to turn it on and enable current to flow from said anode connection to said cathode connection via said diode and BJT structures; and said device further arranged such that a voltage applied to said gate connection sufficient to reverse bias a second junction formed at the interface of said shallow N+ region and said P− drift layer forms depletion regions which, when said second junction is sufficiently reverse-biased, merge and form a potential barrier that blocks current flow through the diode and BJT structures and eliminates said base drive current such that said BJT and said switch are turned off.

2. The switch of claim 1, wherein said conductive material is polysilicon which has been heavily-doped with acceptors.

3. The switch of claim 1, wherein said trenches are recessed vertically into said P− drift layer such that said side-walls are approximately perpendicular to the top surface of said P− drift layer.

4. The switch of claim 1, wherein said first N+ substrate and said P− drift layers comprise a semiconductor material having a bandgap voltage greater than that of silicon.

5. The switch of claim 4, wherein said semiconductor material comprises silicon carbide (SiC).

6. The switch of claim 4, wherein said P− drift layer has a thickness of about 12 $\mu$m and said switch has a blocking voltage of at least 1200 volts.

7. The switch of claim 1, wherein said shallow N+ regions comprise nitrogen.

8. The switch of claim 1, wherein said first N+ substrate layer is a bulk substrate material and said P− drift layer is an epitaxial layer grown on said first N+ substrate layer.

9. The switch of claim 1, wherein said P− drift layer is a bulk substrate material and said first N+ substrate layer is implanted or diffused into the backside of said P− drift layer.

10. The switch of claim 1, wherein said switch comprises a plurality of said diode structures, a plurality of said BJT structures, and a plurality of said insulated gate structures interdigitated in said device foundation, each of said insulated gate structures positioned between a respective pair of said diode structures, a respective pair of said BJT structures, or a respective pair of said diode and said BJT structures.

11. The switch of claim 1, further comprising an P type layer which completely envelops said shallow N+ regions.

12. A switch, comprising:
    a device foundation, comprising:
        a first P+ substrate layer,
        an N− drift layer on said first P+ substrate layer, and
        a first electrode which contacts said first P+ substrate layer and provides an anode connection for said device;
    a diode structure, comprising:

said device foundation,
an N+ layer on said N− drift layer, and
a second electrode which contacts said second N+ layer;

a bipolar transistor (BJT) structure, comprising:
said device foundation,
a second P+ layer on said N− drift layer, and
a third electrode which contacts said second P+ layer, said second and third electrodes connected together to provide a cathode connection for said device;

an insulated gate arranged in a trench configuration recessed into said device foundation between said diode and BJT structures, comprising:
a layer of oxide in contact with said N+ layer, said N− drift layer, and said second P+ layer, said layer of oxide forming the walls and bottom of said trench,
a conductive material within said trench which conducts a voltage applied to the top of said trench to said layer of oxide, and
a fourth electrode which contacts said conductive material providing a gate connection for said device; and a shallow P+ region extending from the oxide bottom of said insulated gate into said N− drift layer and extending around the corners formed at the intersections of said gate's oxide side-walls and bottom;

said device arranged such that a voltage applied across said anode and cathode connections sufficient to forward bias a first junction formed at the interface of said diode structure's N− drift and said first P+ substrate layers causes holes to be injected into the N− drift layer portion of said BJT, thereby providing a base drive current to said BJT sufficient to turn it on and enable current to flow from said anode connection to said cathode connection via said diode and BJT structures; and said device further arranged such that a voltage applied to said gate connection sufficient to reverse bias a junction formed at the interface of said shallow P+ region and said N− drift layer forms depletion regions which, when said second junction is sufficiently reverse-biased, merge and form a potential barrier that blocks current flow through the diode and BJT structures and eliminates said base drive current such that said BJT and said switch are turned off.

13. The switch of claim 12, wherein said conductive material is polysilicon which has been heavily-doped with donors.

14. The switch of claim 12, wherein said first P+ substrate and said N− drift layers comprise a semiconductor material having a bandgap voltage greater than that of silicon.

15. The switch of claim 14, wherein said first P+ substrate and said N− drift layers comprise silicon carbide (SiC).

16. The switch of claim 15, wherein said N− drift layer has a thickness of about 12 $\mu$m and said switch has a blocking voltage of at least 1200 volts.

17. A high power switch, comprising:
a device foundation, comprising:
a first N+ substrate layer,
a P− drift layer on said first N+ substrate layer, and
a first electrode which contacts said first N+ substrate layer and provides a cathode connection for said device;

a plurality of diode structures, each of which comprises:
said device foundation,
a P+ layer on said P− drift layer, and
second electrodes which contact the P+ layers of each of said diode structures;

a plurality of bipolar transistor (BJT) structures, comprising:
said device foundation,
a second N+ layer on said P− drift layer, and
third electrodes which contact the N+ layers of each of said BJT structures;

said second and third electrodes connected together to provide an anode connection for said device;

a plurality of insulated gates, each of said insulated gates arranged in a trench configuration and recessed into said device foundation and separating said diode structures and said BJT structures from other ones of said diode structures and said BJT structures, each of said gates comprising:
a layer of oxide in contact with said P+ layer when said gate contacts one of said diode structures, and/or said second N+ layer when said gate contacts one of said BJT structures, said layer of oxide forming the walls and bottom of said trench,
a conductive material within said trench which conducts a voltage applied to the top of said trench to said layer of oxide, and
a fourth electrode which contacts the conductive material in each of said gates to provide a gate connection for said device; and shallow N+ regions extending from the oxide bottoms of respective insulated gates into said P− drift layer and extending around the corners formed at the intersections of said gate's oxide side-walls and bottom;

said device arranged such that a voltage applied across said anode and cathode connections sufficient to forward bias first junctions formed at the interface of said diode structures' P− drift and first N+ substrate layers causes electrons to be injected into the P− drift portions of said BJT structures, thereby providing base drive current to said BJTs sufficient to turn them on and enable current to flow from said anode connection to said cathode connection via said diode and BJT structures; and said device further arranged such that a voltage applied to said gate connection sufficient to reverse bias second junctions formed at the interfaces of said shallow N+ regions and said P− drift layer forms depletion regions which, when said second junctions are sufficiently reverse-biased, merge and form potential barriers that block current flow through the diode and BJT structures and eliminates said base drive current such that said BJTs and said switch are turned off.

18. The high power switch of claim 17, wherein said switch resides on a die in which said P− drift layer and said first N+ substrate layer length and width of said die.

19. The high power switch of claim 18, wherein each of said trenches is a channel which runs the length of said die and said trenches are spaced periodically across the width of said die.

20. The high power switch of claim 18, wherein said diode and BJT structures are approximately cylindrical about a vertical axis and are spaced periodically across the length and width of said die.

21. The high power switch of claim 18, wherein said diode and BJT structures are trench-shaped, run the length of said die, and are spaced periodically across the width of said die.

22. The high power switch of claim 21, wherein each of the trench-shaped diode and BJT structures are divided into a plurality of individual structures spaced periodically along the length of said die, the space between each of said individual structures occupied with a respective one of said insulated gates.

23. The high power switch of claim 17, wherein said diode structures, BJT structures, and insulated gates are interdigitated in said device foundation, each of said insulated gates positioned between a respective pair of said diode structures, a respective pair of said BJT structures, or a respective pair comprising one of said diode structures and one of said BJT structures.

* * * * *